United States Patent [19]

Maruyama et al.

[11] Patent Number: 5,751,055
[45] Date of Patent: May 12, 1998

[54] SEMICONDUCTOR SINGLE CRYSTALLINE SUBSTRATE AND METHOD FOR PRODUCTION THEREOF

[75] Inventors: Tamotsu Maruyama, Annaka; Shigeyuki Sato, Niigata-ken, both of Japan

[73] Assignee: Shin-Etsu Handotai Co., Ltd., Tokyo, Japan

[21] Appl. No.: 385,544

[22] Filed: Feb. 8, 1995

[30] Foreign Application Priority Data

Feb. 12, 1994 [JP] Japan ................... 6-037681

[51] Int. Cl.$^6$ .............. H01L 21/304; H01L 21/20; H01L 29/06
[52] U.S. Cl. .............. 257/618; 437/95; 437/946; 257/623; 257/798
[58] Field of Search .............. 257/48, 618, 623, 257/798; 437/81, 95, 121, 225, 249, 924, 946, 947

[56] References Cited

U.S. PATENT DOCUMENTS

| | | | |
|---|---|---|---|
| 3,834,083 | 9/1974 | Hoshi et al. | 451/168 |
| 4,783,225 | 11/1988 | Maejima et al. | 257/618 |
| 4,925,809 | 5/1990 | Yoshiharu et al. | 437/95 |
| 5,021,862 | 6/1991 | Ogino | 257/618 |
| 5,110,764 | 5/1992 | Ogino | 437/224 |

FOREIGN PATENT DOCUMENTS

| | | |
|---|---|---|
| A-37 440 | 12/1988 | Germany. |
| A-40 33 683 | 6/1991 | Germany. |
| A-55 065429 | 5/1980 | Japan. |
| A-59 227117 | 12/1984 | Japan. |
| A-05 067546 | 3/1993 | Japan. |

Primary Examiner—Stuart S. Levy
Assistant Examiner—Adriana Giordana
Attorney, Agent, or Firm—Ronald R. Snider

[57] ABSTRACT

In a semiconductor single crystalline substrate provided with a protecting film to prevent autodoping on the reverse surface thereof, for growing a vapor-phase epitaxial layer on the main obverse surface thereof, a width of a chamfer is set for locating an edge-crown occurred in consequence of a vapor-phase epitaxial growth on the chamfer, and a gap of a distance is formed between a periphery of the protecting film and an innermost part of the chamfer on the reverse surface.

3 Claims, 7 Drawing Sheets

SEMICONDUCTOR SINGLE CRYSTALLINE SUBSTRATE AND METHOD FOR PRODUCTION THEREOF

BACKGROUND OF THE INVENTION

1. Field of the Invention

This invention relates to a semiconductor single crystalline substrate for vapor-phase growth of an epitaxial layer on the main surface thereof and a method for the production thereof. More particularly, this invention relates to a semiconductor single crystalline substrate such that, when the vapor-phase growth of a very thick epitaxial layer is in process thereon, the otherwise possible occurrence of edge-crowns is precluded by the usage of the substrate and a method for the production of the semiconductor single crystalline substrate.

2. Description of the Prior Art

The technique of vapor-phase epitaxial growth resides in attaining vapor-phase growth of a single crystalline thin-film layer for use in the production of such integrated circuits as bipolar transistors and MOSLSI's. This technique constitutes a very important method because it allows epitaxial growth on a clean semiconductor single crystalline substrate with a uniform single crystalline thin film of which crystal orientation is identical with it of the semiconductor single crystalline substrate and permits formation of a steep impurity concentration gradient having a junction with a large difference of dopant concentration.

The reactors for vapor-phase epitaxial growth are known in three types, i.e., the vertical type (pancake type), the barrel type (cylindrical type), and the horizontal type. These reactors share a common operating principle of accomplishing the growth of an epitaxial layer, by first, mounting a given semiconductor single crystalline substrate on a susceptor which is a heating plate made of a graphite having a dense SiC coating provided on the surface of the plate, heating the substrate to a predetermined reaction temperature, and introducing a raw material gas into the reaction site for growing an epitaxial layer by thermal decomposition or reduction with hydrogen.

The semiconductor single crystalline substrate, for the sake of allowing an epitaxial layer of high quality to be grown thereon, is furnished with various devices.

The periphery of the semiconductor single crystalline substrate is given a beveled edge by a work called a chamfering. The substrate, while being handled or conveyed, tends to sustain cracks or chippings on the periphery thereof by collision against a hard object. The semiconductor single crystalline substrate, while the vapor-phase epitaxial growth is in process, induces abnormal growth called an edge-crown on the periphery thereof. The chamfering, therefore, is required to diminish these detrimental phenomena. Numerous inventions covering this technique of chamfering have been applied for patent. JP-A-49-43,881 has issued from one such patent application.

Figure 8:
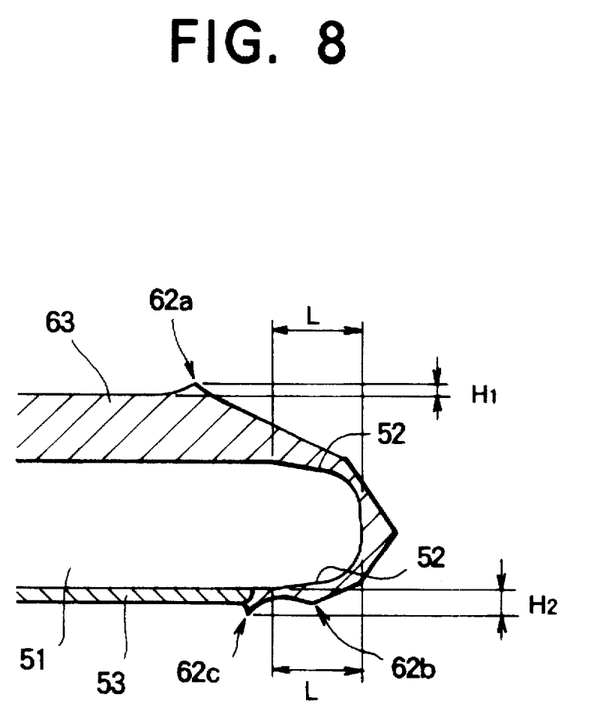
FIG. 8 is an explanatory diagram illustrating front and rear crowns produced during the growth of a very thick epitaxial wafer by the use of a conventional substrate.

When a silicon epitaxial wafer with a very thick epitaxial layer is to be prepared for use such as, for example, in the production of such high breakdown voltage large-current elements as IGBT (insulated gate bipolar transistor) which are creating growing demands in recent years, the silicon epitaxial wafer to be used therein forms edge-crowns (62a, 62b, and 62c) of a hardly ignorable height in the peripheral part thereof on the obverse and on the reverse side as illustrated in FIG. 8, though this silicon epitaxial wafer has undergone the chamfering work. The dimensional tolerance heretofore observed in the chamfering work performed on the peripheral part of a substrate has been specified on the assumption that an epitaxial layer is to be grown to a thickness of some tens of micrometers at most. It is not necessarily proper for application to the growth of an epitaxial layer having a thickness exceeding 100 μm.

When a very thick epitaxial layer is grown by the use of a vertical type reactor for vapor-phase epitaxial growth, the edge-crowns mentioned above occur in the peripheral part of an epitaxial wafer on the main obverse side and on the reverse side. The positions where the edge-crowns occur in the peripheral part of the substrate are fixed by the plane orientation of the substrate. When the plane orientation of the main obverse surface is {100}, for example, the edge-crowns occur each at four positions near the peripheral part of the main obverse surface in the direction of <011>.

As illustrated in FIG. 8, the edge crown 62a which occurs on the main obverse surface side (hereinafter referred to as "front crown") is formed on the interface between an epitaxial layer 63 grown on the main obverse surface side of a single crystalline substrate 51 and a facet appeared on a chamfered part 52. The edge crowns 62b and 62c which occur on the reverse surface side of the single crystalline substrate 51 (hereinafter referred to as "rear crowns") is formed on the interface between an epitaxial layer grown around the chamfered part on the reverse surface side of the substrate 51 and the facet appeared on the chamfered part 52 (62b), and on a plane in such a manner as to cover the edge of the peripheral part of a protecting film 53 for preventing the phenomenon of autodoping (62c).

The height of the edge-crowns are measured by referring the main obverse surface and the reverse surface of the single crystalline substrate 51 as the standard planes. The height HI of the front crown 62a is measured by referring the surface of the epitaxial layer grown on the main obverse surface of the substrate 51 as the standard plane, and the height H2 of the rear crowns 62b and 62c is measured by referring the reverse surface of the substrate after the removal of the protecting film 53 as the standard plane.

When a conventional semiconductor single crystalline substrate is used, the height H1 of the front crown 62a, can be reached to 30 μm in an epitaxial layer grown to about 100 μm, depending on the growth conditions. If the height H1 of the front crown 62a exceeds 10 μm, the subsequent process of a device fabrication will be at a disadvantage by causing the front crown 62a to contact with a mask for the formation of a photolithographic pattern at the peripheral part and consequently impairing the contact tightness between the mask and the epitaxial layer 63 and degrading the sharpness of the pattern.

If the height H2 of the rear crowns 62b and 62c exceeds 10 μm, since the single crystalline substrate 51, while being vacuum chucked on the reverse surface side thereof, is bent concavely with the peripheral part thereof pushed up by the rear crown 62b, the subsequent process of a device fabrication will be at a disadvantage in impairing the contact tightness between the mask for the formation of a photolithographic pattern and the epitaxial layer 63 and consequently degrading the sharpness of pattern in the same manner as the front crown 62a occured on the main obverse surface side. Also, if the height H2 of the rear crown 62b exceeds 10 μm, the single crystalline substrate 51 tends to be coupled with the susceptor during the growth of the epitaxial layer 63 and, deformation due to the thermal stress generated between the coupled spots of the substrate and the susceptor during cool down will eventually cause cracks and slips.

Heretofore, in the growth of a very thick epitaxial layer, efforts have been made to confine the heights of edge-crowns within 10 μm by suitably selecting the type of a vapor-phase growth reactor, the shape of a pocket of the susceptor for retaining the substrate, and the growth conditions such as reaction temperature and growth rate.

When a barrel type vapor-phase growth reactor is used for growing an epitaxial layer in the place of the vertical type vapor-phase growth reactor, edge-crowns occur exclusively on the main obverse surface side. Since this type of reactor retains a single crystalline substrate by tilting against a substantially upright susceptor, and consequently an area of the chamfered part of the single crystalline substrate contacts with the lower lateral wall of the pocket of the susceptor inevitably, the contact area of the chamfered part of the single crystalline substrate tends to be coupled with the lower lateral wall of the pocket via the epitaxial deposition and inflicts cracks and slips thereon when the epitaxial layer is grown very thick.

When the depth of the pocket of the susceptor for retaining the substrate is made deeper, the reaction gas supply to the periphery of the poket becomes less. Thus, the height of edge-crowns decreases as the depth of the pocket is deeper. On the other hands, the epitaxial layer thickness becomes thinner by a low growth rate at the periphery of the layer, resulting the thickness distribution becomes worth.

The height of the front crown becomes lower and that of the rear crowns becomes higher when the growth rate is increased. Conversely, the height of the front crown becomes higher and that of the rear crowns becomes lower in proportion as the growth rate is decreased. In short, the edge-crowns on the obverse and the reverse surface side cannot be lower simultaneously by varying the growth rate.

The height of the rear crowns will be lower if the protecting film for preventing autodoping is not provided on the reverse surface side. However, when an epitaxial layer is grown by vapor-phase reaction on a heavily doped substrate without the protecting film, it entails autodoping which has an adverse effect on an impurity concentration profile in the transition zone of the substrate and on the impurity concentration distribution in the peripheral part of the epitaxial layer.

SUMMARY OF THE INVENTION

This invention is directed to the solution of the problem remarked above and is aimed to provide a semiconductor single crystalline substrate with a simple construction such that, while the vapor-phase growth of a very thick epitaxial layer is in process thereon, the occurrence of edge-crowns both on the main obverse surface side and the reverse surface side will be repressed, and the repression of the occurrence of edge-crowns on the main obverse surface side and the reverse surface side will be attained while the phenomenon of autodoping is prevented and the in-plane resistance distribution of the epitaxial layer is kept uniform.

BRIEF DESCRIPTION OF THE DRAWINGS

The invention will be better understood and the objects and features thereof other than those set forth above will become apparent when consideration is given to the following detailed description thereof, which makes reference to the annexed drawings wherein.

DETAILED DESCRIPTION OF THE REFERRED EMBODIMENTS

The semiconductor single crystalline substrate of he present invention is so chamfered as to fulfill the technical task imposed in association with the problems of the prior art mentioned above and is characterized by setting the width of a chamfer (the distance between the outermost part of the semiconductor single crystalline substrate and the innermost of the chamfer) so that an edge-crown occurred by a vapor-phase epitaxial growth locate on the chamfer.

The semiconductor single crystalline substrate of the present invention is provided with a chamfer and has a protecting film for preventing autodoping formed on the reverse surface thereof, and vapor-phase epitaxial layer is grown on the main obverse surface thereof. This semiconductor single crystalline substrate is formed a gap distance between the periphery of the protecting film and the innermost part of the chamfer on the reverse surface, and set the width of the chamfer so that edge-crowns occurred by a vapor-phase epitaxial growth locate on the chamfer.

In the semiconductor single crystalline substrate mentioned above, the gap of a distance D [FIG. 2c] between the periphery of the protecting film and the innermost part of the chamfer on the reverse surface is desired to be not more than 5 mm. More desirably, this distance D is not less than 0.5 mm and not more than 2 mm. In the embodiment of this invention in the form of a semiconductor silicon single crystalline substrate with a plain orientation {100} of the main obverse surface thereof having an off-angle of about 0° and an epitaxial layer being grown on the main obverse surface thereof, the width of the chamfer is desired to be not less than 570 μm. This invention manifests the effect thereof prominently when the thickness of the vapor-phase epitaxial growth is not less than 100 μm.

The method for the production of the semiconductor single crystalline substrate of this invention is characterized by the steps of preparing a semiconductor single crystalline substrate provided with a chamfer and formed a protecting film for preventing autodoping on the reverse surface thereof, attaching corrosion-resistant planar packings having an outside diameter substantially equal to the diameter of the semiconductor single crystalline substrate and having an annular step formed in the peripheral part on each of the surfaces thereof to the each surface of the semiconductor single crystalline substrate, stacking a plurality of the substrates and the packings tightly thereby obtaining a pile, immersing the pile in an etchant thereby removing the parts of the protecting films not attached to the packings, and forming a gap between the periphery of protecting film and the innermost part of the chamfer each on the reverse surface.

In the method of this invention for the producing of the semiconductor single crystalline substrate mentioned above, the pile of substrates and the packings is desired to be immersed in a surface-active agent to permit an etchant permeating between the peripheral parts of the packings and the peripheral parts of the semiconductor single crystalline substrates before the pile is immersed in the etchant.

The front crown locates in the interface between the epitaxial layer grown on the main obverse surface side and the facet formed on the chamfer. Since the location of the interface mentioned above is determined by the growth rate difference between the epitaxial layer grown on the main obverse surface and the facet formed on the chamfer, the location is strongly affected by the crystal orientation of the main obverse surface determining the growth rate of crystal, the size of the off-angle, and the crystal orientation of the chamfer, but it is not affected by the width of the chamfer.

Figure 1:
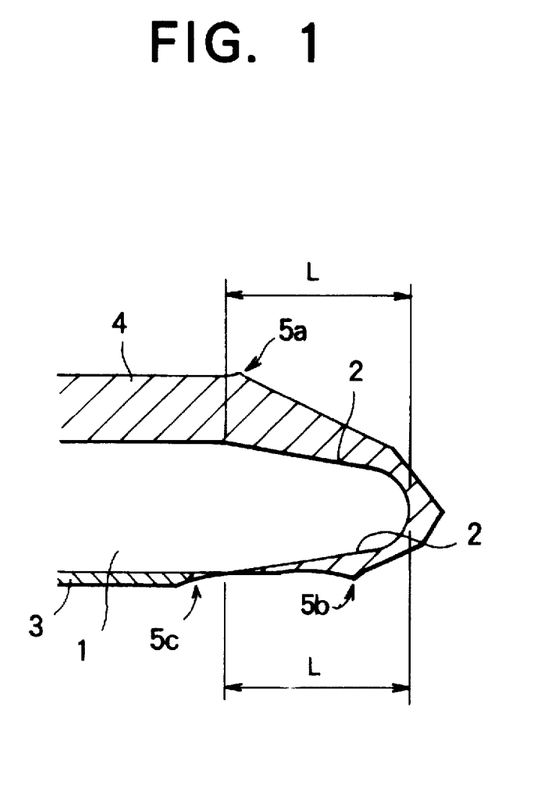
FIG. 1 is an explanatory diagram illustrating the condition of occurrence of edge crowns in the vapor-phase growth of an epitaxial layer on a substrate according to this invention.

In short, the location of the front crown 62a is substantially constant without affected by the width of the chamfer as long as the crystal orientation of the main obverse surface, the size of the off-angle, and the crystal orientation of the chamfer are constant. When the width L of a chamfer is narrow as the conventional substrate shown in FIG. 8, the front crown 62a locates on the main obverse surface. When the width L of the chamfer is wide enough as shown in FIG. 1, on the other hand, the front crown 5a is located on the chamfer because the distance between the location of the front crown 5a and the outermost part of the chamfer 2 is constant. As the location of the front crown 62a on the chamfer 2 is apart from the boundary between the main obverse surface and the chamfer, since the chamfer 2 is beveled, the extent of the front crown 62a thrusting upward from the main obverse surface decreases, and since the facet surface is grown flat, the skirt of the front crown 62a is absorbed in the facet surface and the front crown 62a becomes substantially and apparently short.

The rear crown 62b located on the side closer to the outermost part of the chamfer as shown in FIG. 8 has a similar phenomenon as the front crown 62a. When the width L of the chamfer is wide as shown in FIG. 1 and the location of the rear crown 62b closer to the outermost part of the chamber is apart from the boundary between the reverse surface and the chamfer, the extent of the rear crown 62b thrusting upward from the reverse surface decreases, and since the facet surface is grown flat, the skirt of the rear crown 62b is absorbed in the facet surface and the rear crown 62b becomes substantially and apparently short.

The rear crown 62c locates on the periphery of the protecting film 53 for preventing autodoping. When the width L of the chamfer is wider, the distance between the rear crown 62c and the outermost part of the chamfer 52 is longer. As a result, the height of the rear crown 62c becomes lower, because the raw material gas flowed around the substrate 51 onto the rear surface side is increasingly consumed on the elongated chamfer.

The front crown 62a occurs each at four positions in the direction of <011> near the periphery of the main obverse surface when the plane orientation of the main obverse surface is (100). The particular one of these front crowns 62a that occurs on the orientation flat part formed in the position of the plane orientation {100} is the most conspicuous. On the chamfered part of the orientation flat mentioned above, facets of the plane orientations {111} and {311} are grown. The {111} plane forms an angle of 55° and the {311} plane forms an angle of 25° relative to the {100} plane. The front crown 62a occurs in the interface between the main obverse surface of the plane orientation {100} and the facets of the plane orientation {311}.

Figure 5:
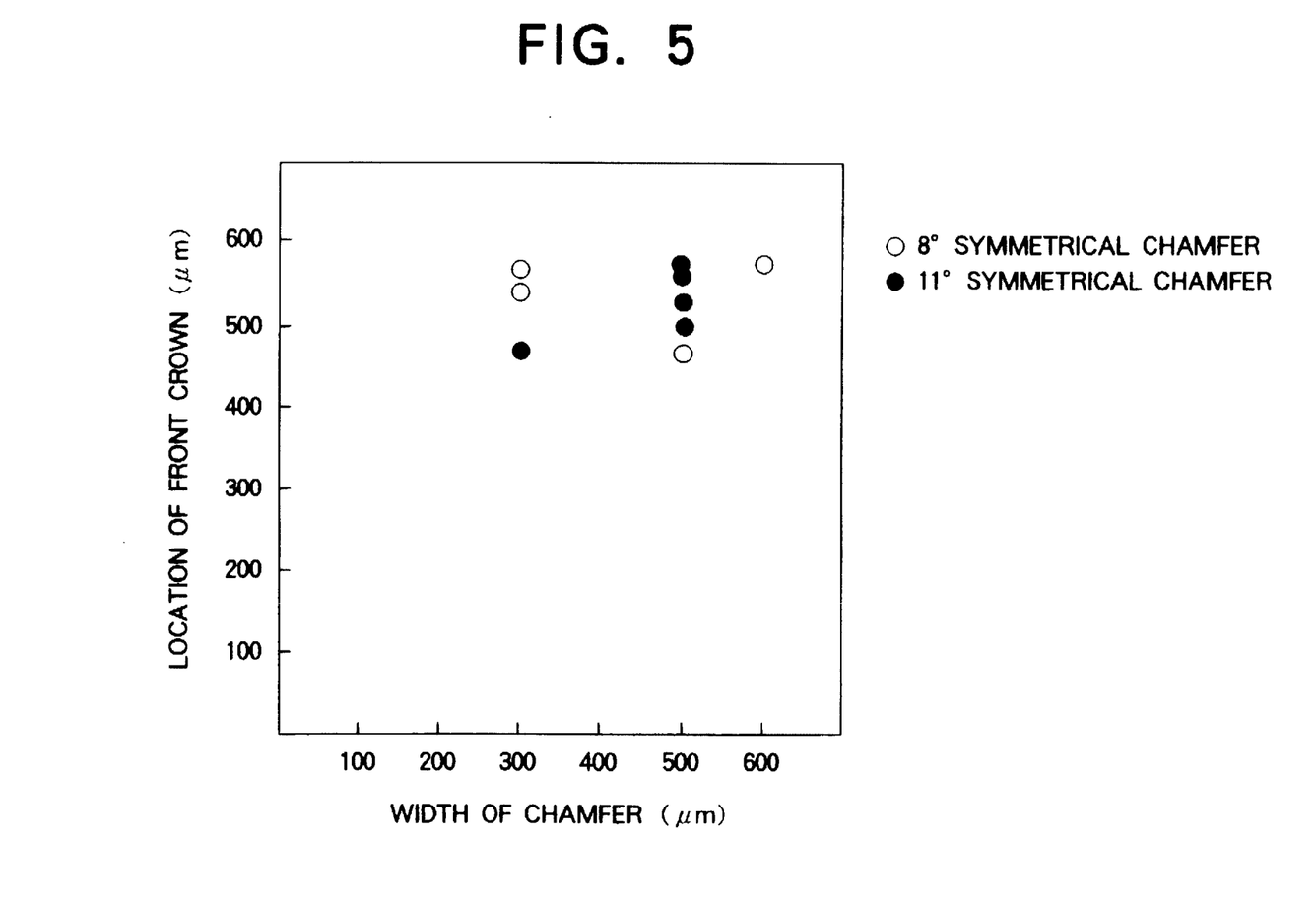
FIG. 5 is a graph showing the relation between the width of a chamfer and the location of front crowns.

The locations of the front crowns 62a from the outermost part of the chamfer 52 are roughly equal and independent to the width of chamfer as long as the plane orientation of the main obverse surface, the size of the off-angle, and the plane orientation of the chamfer are invariable. In the case of a silicon epitaxial layer grown by the vapor-phase method on the main obverse surface of a semiconductor silicon single crystalline substrate 51 having a plane orientation of {100} and an off-angle of about 0°, the relation between the locations of the front crowns 62a occurred on the orientation flat and the widths L of chamfers having a symmetrical bevel of 8° or 11° are shown in FIG. 5. In the figure, the horizontal axis is the scale of the width of chamfer (the distance between the outermost part of the substrate 51 and the innermost part of the chamfer) L, and the vertical axis is the scale of the location of the front crowns 62a (the distance from the outermost part of the substrate 51 to the peak of the front crowns 62a).

It is remarked from FIG. 5 that the location of front crowns 62a are roughly constant and independent to the angle of chamfer or the width of chamfer. No front crown 62a is located at a position not less than 570 μm from the outermost part of the substrate 51. In other words, in the semiconductor silicon single crystalline substrate 51 having a plane orientation of {100} and an off-angle of about 0° and containing a chamfer of a width of not less than 570 μm, the front crowns locate at the chamfer and the height H1 of the front crowns is low when a silicon epitaxial layer is grown by the vapor-phase method on the main obverse surface of the substrate. This trend is similarly observed with respect to the rear crowns 62b and 62c.

Concerning the chamfer contour of the semiconductor single crystalline substrate 1, the bevel angles of the chamfer 2 may be either symmetrical or asymmetrical between the main obverse surface side and the reverse surface side as long as the width of chamfer is so set that the edge-crowns locate on the beveled surfaces of chamfer.

In accordance with this invention, the front and the rear crowns can be repressed as described above by assigning an enough width for the chamfer. The height of the front and the rear edge-crowns can be repressed more effectively by combining the assignment of an enough width to the chamfer with the provision of a suitable distance between the periphery of the protecting film and the innermost part of the chamfer on the reverse surface, described hereinafter.

The semiconductor single crystalline substrate is provided on the reverse surface thereof with a protecting film made of an oxide or a nitride for the purpose of preventing the phenomenon of autodoping from the rear surface side of the substrate. The term "autodoping" refers to the phenomenon that a dopant in a semiconductor single crystalline substrate is released into the ambient gaseous phase and then doped into a layer in the process of growing. It has an adverse effect on the dopant concentration profile of the transition zone or the impurity distribution at the periphery of the layer.

In the initial stage of the vapor-phase epitaxial growth, the dopant which causes the autodoping phenomenon is released both from the main obverse surface side and the rear surface side of the substrate. As the epitaxial layer grows and eventually covers the main obverse surface of the substrate, the dopant gas is released substantially only from the reverse surface side. It is, therefore, important that the rear surface side of the substrate is covered with the protecting film for preventing autodoping. The protecting film for preventing autodoping is formed by coating the reverse surface side of the substrate with a nitride film or an oxide film by the CVD process or the thermal oxidation process. During the process, the protecting film as described above grows on the chamfer of the substrate as well.

During the vapor-phase epitaxial growth, the protecting film mentioned above can prevent the autodoping. The portion of the protecting film which has grown on the chamfer of the substrate, however, must be removed in advance of the process of epitaxial growth. Otherwise, the chamfer is suffered to give rise to nodules in the process of the epitaxial growth. The term "nodules" means small polycrystalline masses abnormally grown on the chamfer. The nodules, while the substrate is in process of transfer, tend to peel off from the substrate and adhere to the surface of the epitaxial layer causing serious degrade of the surface quality. In the process of manufacturing a semiconductor element, the nodules tend to inflict scratches on the exposure mask and cause pinholes in the oxide film and give rise to various troubles.

As a measure to prevent the occurrence of these nodules, the invention of JP-A-01-248,527 teaches a method which comprises the tightly of attaching corrosion-resistant plates tightly to the each surface of a semiconductor substrate, and immersing the resultant pile of the stacking in an etchant for removing the unnecessary part of the protecting film grown on the chamfer of the semiconductor substrate. In accordance with this invention, the part of the protecting film grown on the chamfer can be exclusively removed, and the part of the protecting film grown on the reverse surface of the substrate can be retained intact to the innermost part of the chamfer.

During the vapor-phase reaction, the raw material gas diluted with hydrogen gas reaches not only the main obverse surface side of the semiconductor single crystalline substrate but also the chamfer and the peripheral part on the reverse surface side of the substrate, and induces growth of an epitaxial layer there. Meanwhile on the reverse surface side of the substrate, since an epitaxial layer does not grow the protecting film made of a nitride or an oxide, the protecting film functions as an obstruction against the growth of an epitaxial layer. Along the periphery of the protecting film, therefore, the epitaxial layer grows over the protecting film abnormally and forms crowns. This is the cause of the rear crowns 62c [FIG. 8]. The height H2 of the rear crowns 62c can be ignored normally. However, in the growth of a very thick epitaxial layer such as IGBT, the height H2 of the rear crowns 62c can not be ignored anymore.

The occurrence of the rear crowns 62c can be repressed by preparing a gap of a suitable distance between the periphery of the protecting film and the innermost part of the chamfer on the reverse surface, and this gap of a distance reserves for ample growth of the epitaxial layer in the peripheral part on the reverse surface of the substrate. When the size (distance) D of the gap between the periphery of the protecting film and the innermost part of the chamfer on the reverse surface is not more than 5 mm, preferably not less than 0.5 mm and not more than 2 mm, the autodoping toward the main obverse surface of the substrate does not occur substantially because the epitaxial layer grows onto the gap and serves as a film for preventing autodoping during the initial stage of the vapor-phase reaction.

As the distance D of the gap increases beyond 5 mm, however, the raw material gas reaches to the periphery of the protecting film with increasing difficulty and the epitaxial layer eventually cannot grow because the reverse surface of the substrate is in contact with the pocket of the susceptor. Therefore, when the distance D of the gap exceeds 5 mm, the excess will do more harm than good because the autodoping is markedly exalted in spite of a slight improvement in the repression of the the rear crowns 62c.

The formation of the gap of the suitable distance mentioned above is accomplished by the steps of preparing a semiconductor single crystalline substrate provided with a chamfer and formed a protecting film for preventing autodoping, on the reverse surface thereof attaching corrosion-resistant planar packings having an outside diameter substantially equal to the diameter of the semiconductor single crystalline substrate and having an annular step formed in the peripheral part thereof on each of the opposite surfaces thereof to the each surface of the semiconductor single crystalline substrate, stacking a plurality of products of the fast union mentioned above thereby obtaining a pile, and immersing the pile in an etchant thereby removing the parts of the protecting films not attached to the packings, and forming a distance between the periphery of the protecting films and the innermost parts of the chamfers on the reverse surface. When the pile of the products of fast union mentioned above is immersed in a surface-active agent before it is immersed in an etchant, the periphery of the protecting film can be matched more precisely with the contour of the annular steps of the packings because the treatment with the surface-active agent enables the etchant to permeate between the peripheral parts of the packings and the peripheral parts of the semiconductor single crystalline substrates.

Now, this invention will be described more specifically below with reference to preferred embodiments thereof illustrated in the annexed diagrams. It should be noted that the dimensions, materials, shapes, and other relative dispositions of the component parts mentioned in the embodiments are meant to be purely illustrative of this invention and not limitative of the scope of this invention.

EXAMPLE 1

Figure 2A:
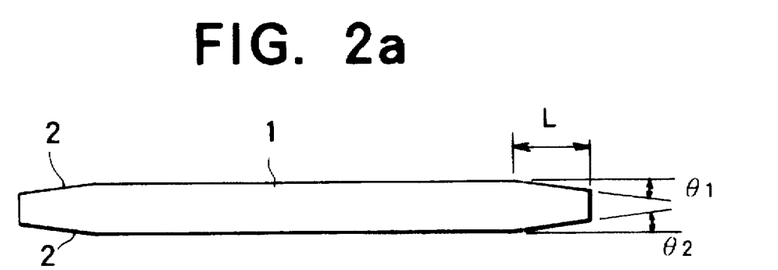
FIG. 2 is an explanatory diagram illustrating the steps of process for the production of a semiconductor epitaxial wafer with sequentially changing cross sections of the wafer; (a) representing a substrate, (b) a step of growth of a protecting film, (c) a step of etching the protecting film, and (d) a step of vapor-phase growth of an epitaxial layer.
Figure 2B:
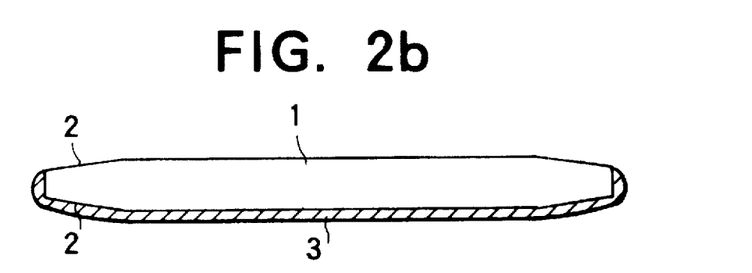

First, as illustrated in FIG. 2, an n type CZ silicon single crystalline substrate 1 measuring 125 mm in diameter and 465 µm in thickness, exhibiting plane orientation (100) and resistivity of 0.015 Ω·cm, having a chamfer 2 symmetrically beveled at an equal angle of 8° (θ1 and θ2) on the main obverse surface side and the reverse surface side by a numerical control method [FIG. 2a], and having a protecting film 3 formed by growing a CVD oxide film on the reverse surface [FIG. 2b] was prepared. Then, a periphery of about 1 mm was removed from the protecting film 3, and the main obverse surface of the substrate was mirror polished [FIG. 2c]. In this example, three kinds of substrates varing in the width of chamfer are prepared.

Figure 2C:
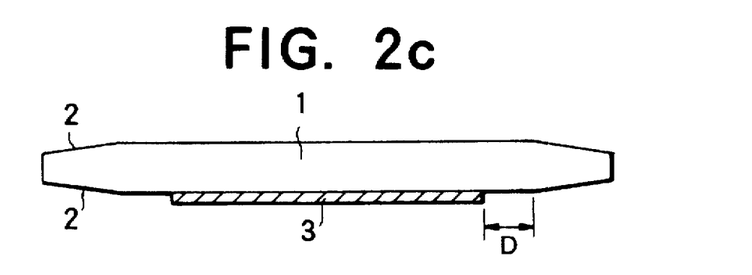
Figure 2D:
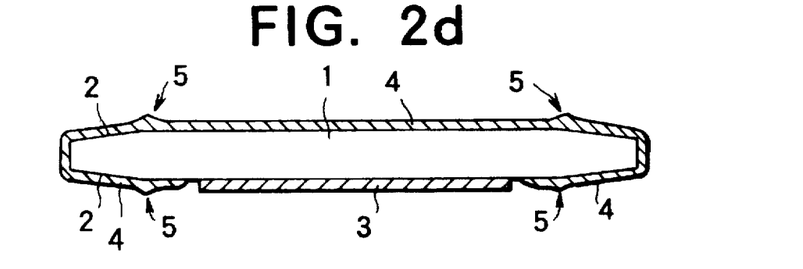

Then, the substrate 1 consequently obtained was set in a vertical vapor-phase epitaxial growth reactor and the reactor was operated under the temperature of 1130° C. and growth rate of 1.5 µm/min to grow a phosphorus-doped n type silicon epitaxial layer 4 having a thickness of 200 µm and resistivity of 80 Ω·cm on the main obverse surface [FIG. 2d].

After the growth of the silicon epitaxial layer 4, the heights of edge-crowns [FIG. 2d] which located at an orientation flat formed on a crystal plane indicated by the following formula (1), the heights of front crowns 5a and rear crowns 5b and 5c shown in FIG. 1, were measured. The relation of these heights and the width L of chamfer is shown in FIG. 6.

$$(01\bar{1}) \quad\quad (1)$$

Figure 6:
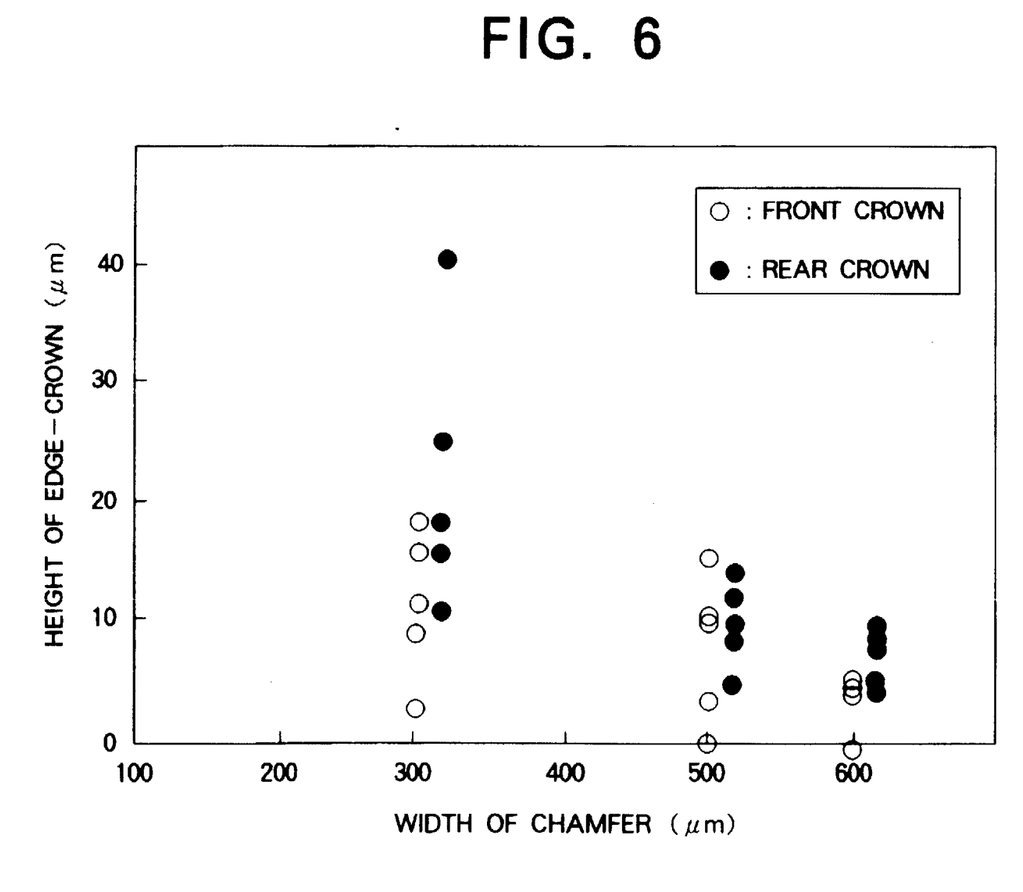
FIG. 6 is a graph showing the relation between the width of a chamfer and the heights of front and rear crowns.

As shown in FIG. 6, the front crowns had a height of about 20 μm when the width L of chamfer was 300 μm or 500 μm, and the front crowns had a roughly halved height of not more than 10 μm when the width L of chamfer was 600 μm. The rear crowns had a height as large as about 40 μm when the width L of chamfer was 300 μm, the rear crowns had a height of about 15 μm when the width L of chamfer was 500 μm, and the rear crowns had a markedly decreased height of about 10 μm when the width L of chamfer was 600 μm.

EXAMPLE 2

An n type CZ silicon single crystalline substrate 1 measuring 125 mm in diameter and 465 μm in thickness, exhibiting plane orientation (100) and resistivity of 0.015 Ω·cm, and having a chamfer 2 beveled with a width (L) 600 μm symmetrically at an equal angle of 8° (θ1 and θ2) on the main obverse surface side and the reverse surface side was prepared [FIG. 2a].

Then, on the entire reverse surface of the substrate 1, a protecting film 3 for preventing autodoping was formed by growing an oxide film of 1000 nm in thickness by the normal pressure CVD method [FIG. 2b]. Subsequently, planar packings 11 made of polyvinyl chloride, as shown in FIG. 4, having an outside diameter substantially equal to the diameter of the substrate 1 and having an annular step formed in the peripheral part thereof on each of the opposite surfaces thereof were attached to the each surface of the substrate 1, as shown in FIG. 3 to complete a pile stacked tightly with concentric from some tens to some hundreds of substrates 1.

Figure 3:
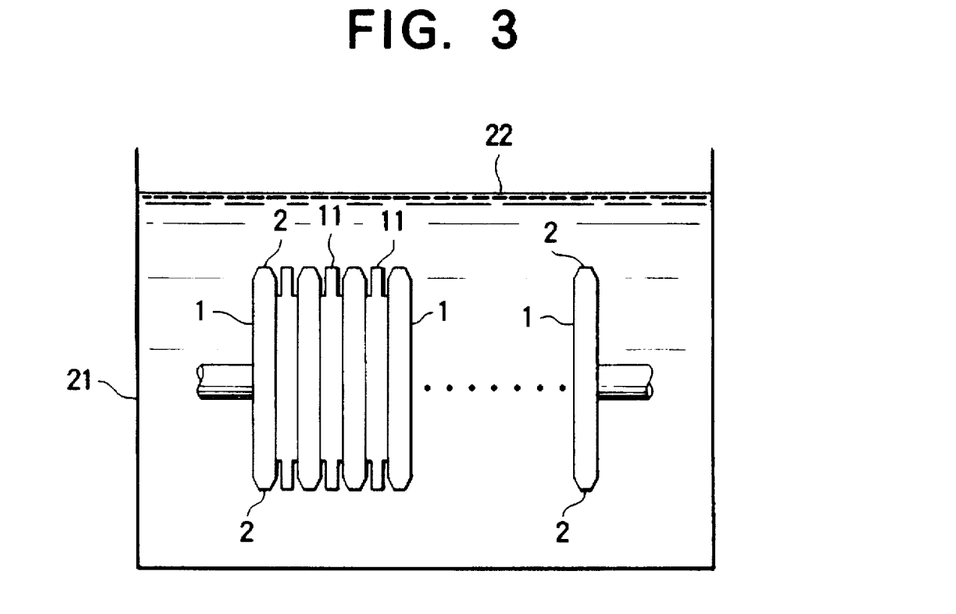
FIG. 3 is an explanatory diagram illustrating a step of etching the peripheral parts of protecting films grown on the reverse surface side of the substrates.
Figure 4:
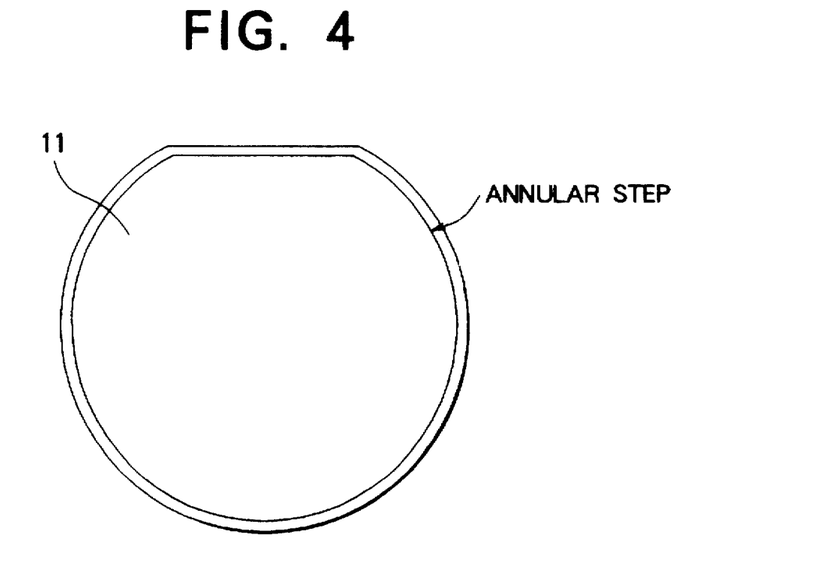
FIG. 4 is a front view of a packing for etching.

Then, the pile was immersed in an etchant 22 such as hydrofluoric acid stored in an etching tank 21 as shown in FIG. 3 so as to remove by etching the parts of the protecting films which were not attached to the packings 11 and were exposed to the etchant 22, namely, the parts on the chamfer 2 and the parts of a suitable distance from the innermost parts of the chamfer 2 on the reverse surface (the parts indicated by "L+D" in [FIG. 2c]} were etched off, while parts of the protecting films 3 held in contact with the packings 11 were kept intact. As a result, the distance D between the periphery of the protecting film 3 and the innermost part of the chamfer 2 on the reverse surface was prepared with a desired magnitude [FIG. 2c]. When the pile was immersed in a surface-active agent having a concentration of from 0.1 to 1% before the immersion in the etchant 22, the boundaries between the protecting films and the etched parts were formed with increased sharpness.

After the CVD process was completed, the main obverse surface of the substrate 1 on which no oxide film had been grown was mirror polished by a mechanical-chemical-polishing. The substrate 1 now containing a mirror surface was loaded in a vertical vapor-phase epitaxial growth reactor. This reactor was operated under the temperature of 1130° C. and growth rate of 1.5 μm/min to form a phosphorus-doped n type silicon epitaxial layer having a thickness of 200 μm and resistivity of 80 Ω·cm on the main obverse surface thereof [FIG. 2d].

Figure 7:
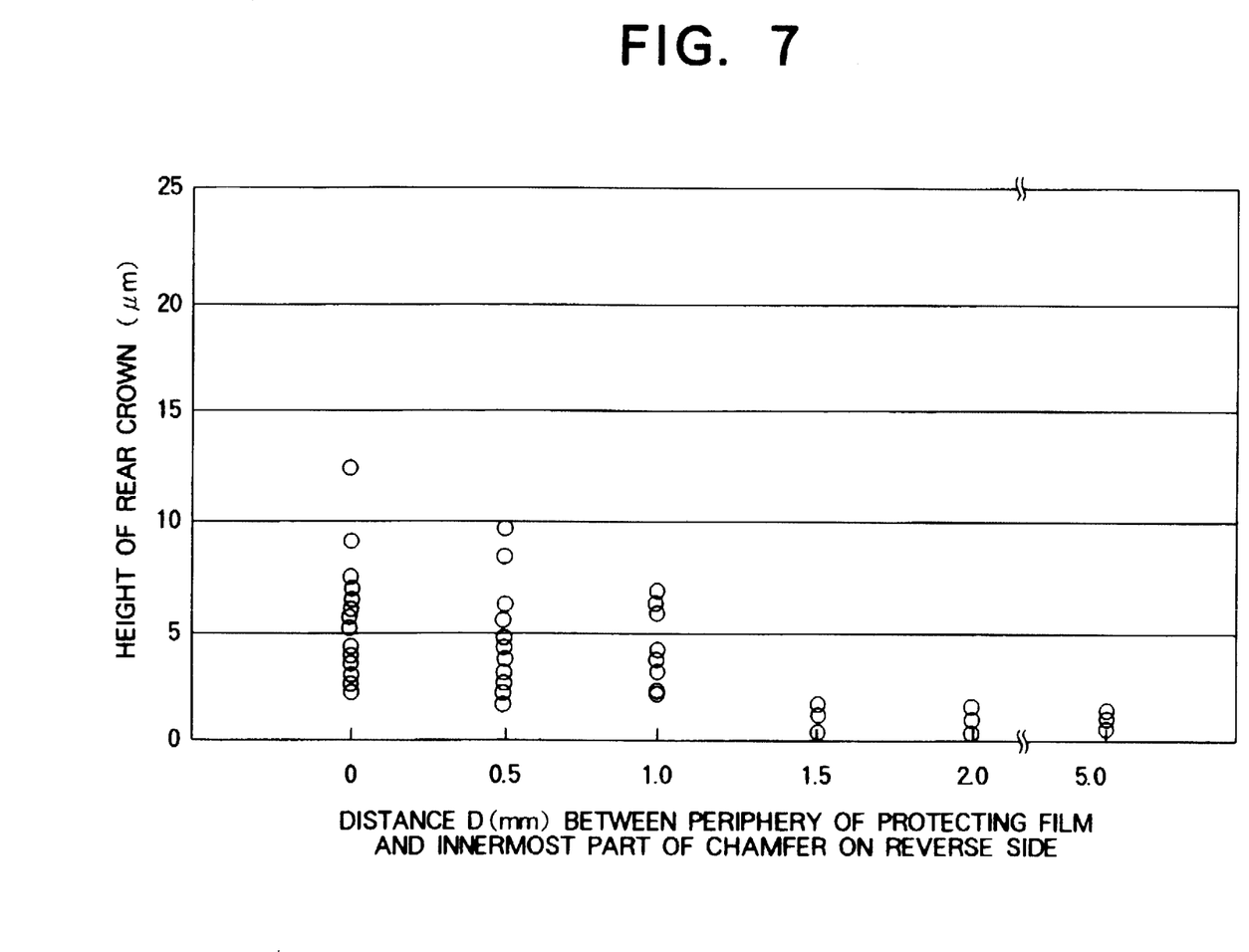
FIG. 7 is a graph showing the tendency of the heights of rear crowns toward the distance D between the periphery of a protecting film and the innermost part of a chamfer.

The effect exerted by the distance D between the periphery of the protecting film 3 for preventing autodoping and the innermost part of the chamfer 2 on the reverse surface toward the height of edge-crowns located on the reverse surface is shown in FIG. 7. It is remarked from the diagram that the height of rear crowns decreased as the distance D increased and that the height roughly leveled off when the distance D exceeded 1.5 mm. When the distance D exceeded 5 mm, however, the influence of autodoping became no longer ignorable and the SR (spreading resistance) value decreased in the peripheral part of the epitaxial layer grown on the substrate.

When the silicon epitaxial layer was grown under the conditions mentioned above on the substrate 1 wherein the distance D between the periphery of the protecting film 3 for preventing autodoping and the innermost part of the chamfer 2 on the reverse surface was 1.5 mm, the edge-crowns had a height of 5 μm on the main obverse surface and 3 μm on the reverse surface. A decrease trend of the SR value was not observed in the peripheral part of the epitaxial layer on the substrate.

While there have been shown and described embodiments of the invention, it is to be distinctly understood that the invention is not limited thereto but may be otherwise variously embodied and practiced within the scope of this invention. For example, while the preceding embodiment represents a case of growing a silicon epitaxial layer by the vapor-phase method on a silicon single crystalline substrate, a compound semiconductor of a IV group or a III–V group may be epitaxially grown on a compound semiconductor substrate instead.

Though the preceding embodiment represents a case of using a main obverse surface having plane orientation of {100}, the present invention can be adapted to the growth of an epitaxial layer on a main obverse surface having some other crystal orientation such as, for example, a plane orientation of {111}. For the width of a chamfer in this case, however, a suitable value must be found by carrying out an experiment similar to the embodiment mentioned above.

As described above, when a very thick epitaxial layer is grown by the vapor-phase growth, the occurrence of front crowns and rear crowns can be repressed in accordance with this invention as by setting the width of a chamfer so that the edge-crowns fall on the beveled surface of the chamfer, or by forming a gap of a suitable distance between the periphery of a protecting film for preventing autodoping and the innermost part of the chamfer on the reverse surface. The occurrence of rear crowns can be restricted while preventing the phenomenon of autodoping thereby, keeping the in-plane resistance uniformity of the epitaxial layer.

What is claimed is:

1. A silicon semiconductor single crystalline substrate comprising a main surface for growing a silicon epitaxial layer, a reverse surface with a protecting film for preventing autodoping and a chamfer having a beveled surface formed at a periphery of the substrate, the chamfer having a width defined by a distance between an outermost part of the substrate and in an innermost part of the chamfer, said substrate being characterized in that the width of the chamfer is determined in order to locate an edge-crown formed by a vapor-phase epitaxial growth on the beveled surface of the chamfer, wherein a gap between a periphery of the protecting film and an innermost part of the chamfer is formed in a size of not less than 0.5 mm and not more than 2 mm, and wherein said protective film does not extend over said chamfer.

2. A silicon semiconductor single crystalline substrate comprising a main surface for crowing a silicon epitaxial layer, a reverse surface with a protecting film for preventing autodoping and a chamfer formed at the periphery of the substrate, the chamfer having a chamfer width defined by a distance between an outermost part of the substrate and an innermost part of the chamfer, the substrate being provided with a plane orientation {100}, an off-angle of about 0° and the chamfer width being not less than 570 μm, wherein a gap between a periphery of the protecting film and innermost part of the chamfer is formed in a size of not less than 0.5 mm and not more than 2 mm, and wherein said protective film does not extend over said chamfer.

3. A silicon semiconductor single crystalline substrate according to claim 2, wherein a thickness of the silicon epitaxial layer is not less than 100 μm.

* * * * *